United States Patent
Yoshida (10) Patent No.: US 10,292,311 B2
(45) Date of Patent: May 14, 2019

(54) HEAT RADIATING SHEET

(71) Applicant: TOYOTA JIDOSHA KABUSHIKI KAISHA, Toyota-shi, Aichi (JP)

(72) Inventor: Yuji Yoshida, Toyota (JP)

(73) Assignee: TOYOTA JIDOSHA KABUSHIKI KAISHA, Toyota-shi, Aichi (JP)

( * ) Notice: Subject to any disclaimer, the term of this patent is extended or adjusted under 35 U.S.C. 154(b) by 0 days.

(21) Appl. No.: 15/854,031

(22) Filed: Dec. 26, 2017

(65) Prior Publication Data

US 2018/0213681 A1    Jul. 26, 2018

(30) Foreign Application Priority Data

Jan. 24, 2017   (JP) ................... 2017-010176

(51) Int. Cl.
| | |
|---|---|
| F28F 7/00 | (2006.01) |
| H05K 7/20 | (2006.01) |
| F28F 13/18 | (2006.01) |
| F28F 3/02 | (2006.01) |
| H01L 23/367 | (2006.01) |
| H01L 23/373 | (2006.01) |
| H01L 21/48 | (2006.01) |
| F28D 21/00 | (2006.01) |

(52) U.S. Cl.
CPC ......... H05K 7/20418 (2013.01); F28F 3/027 (2013.01); F28F 13/18 (2013.01); H01L 21/4878 (2013.01); H01L 23/3672 (2013.01); H01L 23/3737 (2013.01); *B32B 2307/302* (2013.01); *C09J 2477/00* (2013.01); *F28D 2021/0029* (2013.01); *F28F 2245/06* (2013.01); *F28F 2255/06* (2013.01); *F28F 2255/12* (2013.01); *F28F 2255/146* (2013.01)

(58) Field of Classification Search
CPC .... F28F 3/02; F28F 3/027; F28F 13/18; F28F 2245/06; F28F 2255/06; F28F 2255/12; F28F 2255/146; H05K 7/20418; H01L 21/4878; H01L 23/3272; H01L 23/3737; H01L 23/4334; B32B 2307/302; C09J 2477/00; F28D 2021/0029
USPC ......................................... 165/185
See application file for complete search history.

(56) References Cited

U.S. PATENT DOCUMENTS 5,535,816 A * 7/1996 Ishida .................. F28F 3/02
                                                    165/104.33
6,803,258 B2 * 10/2004 Ito ..................... H01L 23/4334
                                                    438/123

(Continued)

FOREIGN PATENT DOCUMENTS

| JP | 2001-291810 A | 10/2001 |
| JP | 2011-086753 A | 4/2011 |

*Primary Examiner* — Davis D Hwu
(74) *Attorney, Agent, or Firm* — Sughrue Mion, PLLC (57) ABSTRACT

Provided is a flexible heat radiating sheet with high thermal conductivity. The heat radiating sheet includes a resin material and a heat radiating member that extends in the planar direction and has a required thickness. The heat radiating member is bent such that in portions of a thin plate member between adjacent slit rows, projecting portions and recess portions are alternately repeated in the X-axis direction, and a projecting portion and a recess portion that are adjacent in the Y-axis direction are located facing each other. The heat radiating member is entirely buried in the resin material excluding apexes of the projecting portions and the recess portions.

6 Claims, 8 Drawing Sheets

(56) References Cited

U.S. PATENT DOCUMENTS

2004/0101707 A1* 5/2004 Tanaka ................... B23K 20/04
                                                    428/614
2012/0080418 A1* 4/2012 Sakamoto ............. B29C 65/224
                                                    219/243

* cited by examiner

[Prior Art]

FIG. 11B

[Prior Art]

FIG. 11C

[Prior Art]

HEAT RADIATING SHEET

CROSS REFERENCE TO RELATED APPLICATIONS

The present application claims priority from Japanese patent application JP 2017-010176 A filed on Jan. 24, 2017, the content of which is hereby incorporated by reference into this application.

BACKGROUND

Technical Field

The present disclosure relates to a heat radiating sheet that is suited for radiating heat generated from, for example, a heat-generating electronic component to the outside.

Background Art

An electronic component that emits heat by itself, like a CPU, may possibly operate improperly when it is overheated. In order to avoid this, a suitable cooling device is used together with the electronic component. Examples of such a cooling device include a heat radiating sheet disclosed in JP 2001-291810 A and a heat transfer device disclosed in JP 2011-086753 A.

The heat radiating sheet disclosed in JP 2001-291810 A includes a thermally conductive adhesive layer, which contains matrix resin and thermally conductive fillers, and an expanded sheet having the thermally conductive adhesive layer carried thereon and expanded in one direction. The heat transport device disclosed in JP 2011-086753 A includes a working fluid encapsulated within a housing, an expanded sheet provided in the housing to form a flow channel for the working fluid, and a capillary structure.

SUMMARY

Figure 11A:
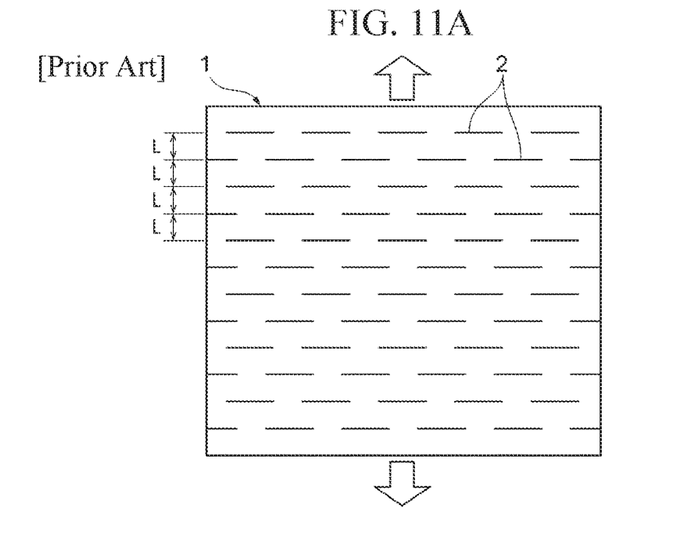
FIGS. 11A to 11C are views for illustration of an expanded sheet that is a heat radiating member used for the conventional heat radiating sheet.
Figure 11B:
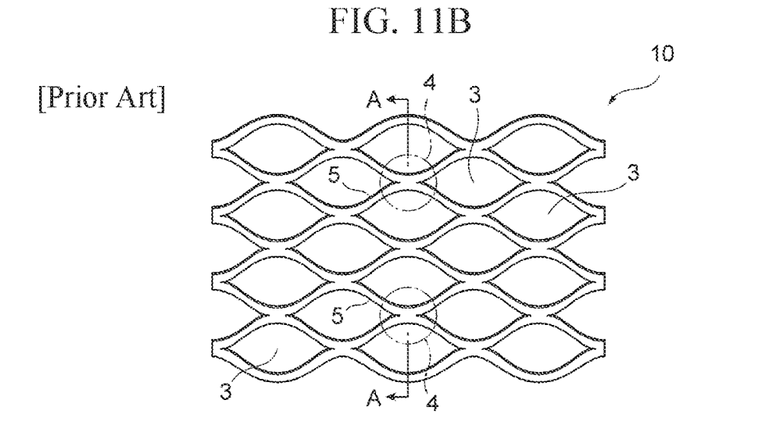

In each of the heat radiating sheet disclosed in JP 2001-291810 A and the heat transfer device disclosed in JP 2011-086753 A, the expanded sheet has the function of a structural member for maintaining the posture and the like as well as the function of a heat conduction path that ensures thermal conductivity or heat radiation performance. As described in JP 2001-291810 A and JP 2011-086753 A, so far, an expanded sheet 10 used for the heat radiating sheet of this type or the like has been obtained by, as shown in FIG. 11A, cutting slits 2. in rows in a staggered pattern at intervals of the width L on a thin metal sheet 1 and stretching (expanding) the metal sheet 1 in the direction orthogonal to the direction of the slits 2. FIG. 11B shows an example of the conventional expanded sheet 10 formed in such a manner, where the portions of the slits 2 are gradually opened in the direction orthogonal to the direction in which the slits 2 are formed when the expanded sheet 10 is stretched. When opened, the portions of the slits 2 deform into diamond-shaped openings 3.

Figure 11C:
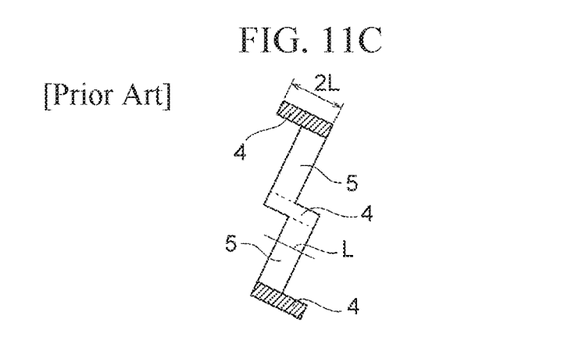

The expanded sheet 10 with such a configuration is obtained by stretching the thin sheet 1. As shown in a cross-sectional view of FIG. 11C along line A-A of FIG. 11B, a region of a connecting portion 4 of the expanded sheet 10 has a width that is double (2L) the distance L between the adjacent slits 2,2, while a strand portion 5 between the connecting portions 4,4 has a width corresponding to the distance L between the adjacent slits 2,2.

Figure 12A:
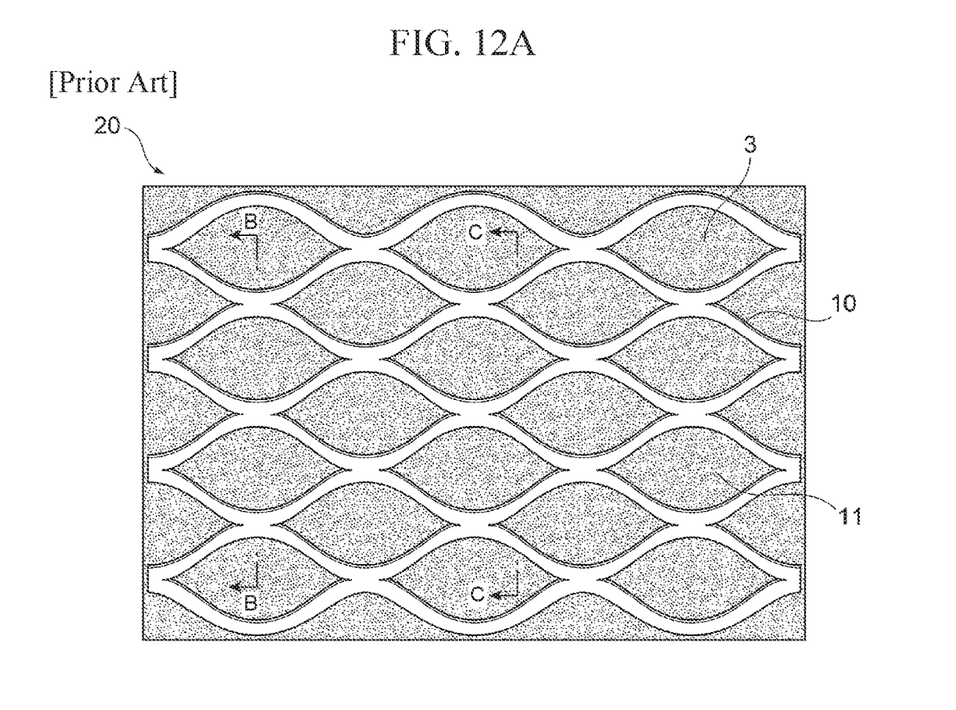
FIGS. 12A to 12C are views for illustration of the conventional heat radiating sheet.
Figure 12B:
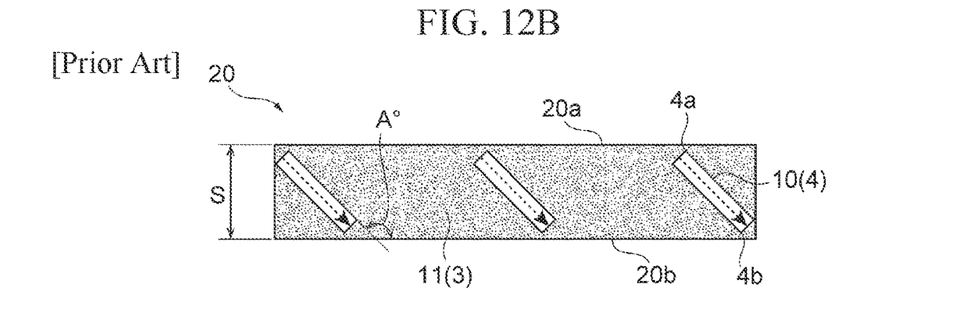
Figure 12C:
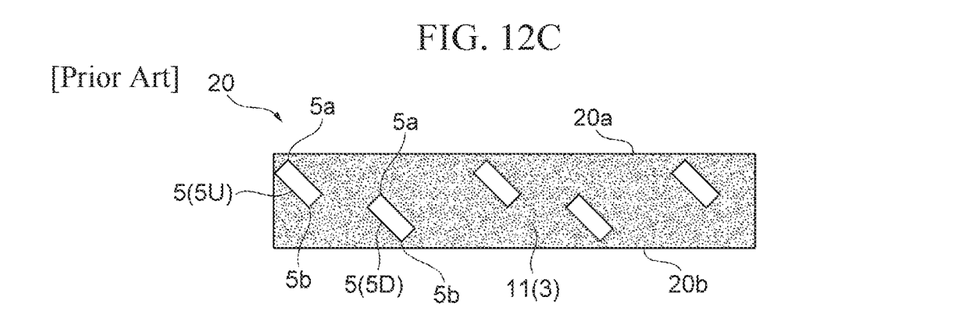

FIG. 12A is a plan view of a heat radiating sheet 20 formed by filling the openings 3 of the expanded sheet 10 with a resin material 11 as a matrix, FIG. 12B is a cross-sectional view along line B-B of FIG. 12A, and FIG. 12C is a cross-sectional view along line C-C of FIG. 12A. As shown in the drawings, the expanded sheet 10 is entirely buried in the resin material 11, and the openings 3 of the expanded sheet 10 are filled with the resin material 11. In the heat radiating sheet 20 with such a configuration, as shown in FIG. 12B, the connecting portions 4 of the heat radiating member 10 regulate the thickness S of the heat radiating sheet 20, and the connecting portions 4 are located across the entire region between an upper surface 20a and a lower surface 20b of the heat radiating sheet 20. In addition, an upper end 4a of each connecting portion 4 is exposed on or is located in close proximity to the upper surface 20a side of the heat radiating sheet 20, while a lower end 4b of each connecting portion 4 is exposed on or is located in close proximity to the lower surface 20b side of the heat radiating sheet 20.

Meanwhile, as shown in FIG. 12C, since the width L of each strand portion 5 is half the width 2L of the connecting portion 4, an upper end 5a of a strand portion 5U located at a higher position in FIG. 12C is exposed on or is in close proximity to the upper surface 20a side of the heat radiating sheet 20, but a lower end 5b thereof is located at almost an intermediate position in the thickness direction of the heat radiating sheet 20 and does not reach the lower surface 20b side of the heat radiating sheet 20. Further, a lower end 5b of a strand portion 5D located at a lower position in FIG. 12C is exposed on or is in close proximity to the lower surface 20b side of the heat radiating sheet 20, but an upper end 5a thereof is located at an intermediate position in the thickness direction of the heat radiating sheet 20 and does not reach the upper surface 20a side of the heat radiating sheet 20.

Therefore, in the conventional heat radiating sheet 20 with such a configuration, it is unavoidable that the function of a heat conduction path will differ between the portions of the expanded sheet 10 where the connecting portions 4 are located and where the strand portions 5 are located. Consequently, when the heat radiating sheet 20 is seen as a whole, formation of a heat conduction path by the heat radiating member 10 unavoidably becomes insufficient, and in order to increase thermal conductivity, it would be necessary to increase the proportion of the heat radiating member 10 to the heat radiating sheet 20. This means that the proportion of the resin material should lowered, which can sacrifice the flexibility of the heat radiating sheet 20.

The present disclosure has been made in view of the foregoing circumstances, and exemplary embodiments relate to providing a heat radiating sheet that can ensure higher thermal conductivity with the required flexibility maintained.

A heat radiating sheet in accordance with the present disclosure basically includes a resin material, and a heat radiating member containing a material with higher thermal conductivity than that of the resin material, the heat radiating member extending in a planar direction and having a required thickness. The heat radiating member includes a thin plate. The thin plate has formed thereon a required number of slit rows each including a required number of linear slits each having a predetermined length and being arranged linearly in an X-axis direction with a required number of non-slit portions each having a predetermined length interposed therebetween, the slit rows being arranged in parallel at intervals in a Y-axis direction orthogonal to the X-axis direction. Portions of the thin plate located between adjacent slits of adjacent slit rows are bent such that projecting portions and recess portions are alternately repeated in the X-axis direction. The bent portions of the thin plate have a shape such that a projecting portion and a recess portion that are adjacent in the Y-axis direction are located facing each other. The heat radiating member is entirely buried in the resin material excluding apexes of the projecting portions and the recess portions.

According to a preferred configuration of the heat radiating sheet, each of the apexes of the projecting portions and the recess portions has a flat surface.

The heat radiating sheet may further include an insulating layer formed on each of front and rear surfaces of the heat radiating sheet. Alternatively, in the heat radiating sheet, the heat radiating member may have an insulating film formed on each of front and rear surfaces thereof.

In the heat radiating sheet, the heat radiating member preferably contains one of a single material or a composite material with a thermal conductivity of greater than or equal to 10 W/m·K.

In the heat radiating sheet, the resin material preferably contains one or more of silicone resin, epoxy resin, urethane resin, polyamide resin, polyphenylene sulfide resin, or polyimide resin.

According to the present disclosure, a heat radiating sheet with high thermal conductivity is provided without sacrificing flexibility.

DETAILED DESCRIPTION

An embodiment of a heat radiating sheet in accordance with the present disclosure will be described with reference to the drawings.

Heat Radiating Member

First, an example of a heat radiating member used for a heat radiating sheet in this embodiment will be described in conjunction with its production steps.

Exemplary materials of the heat radiating member include metal, ceramics, and graphite. Examples of metal include copper, aluminum, gold, silver, nickel, and zinc. Examples of ceramics include alumina, silica, boron nitride, zinc oxide, and magnesium oxide. When ceramics is used, it is preferably molded in the state of a green sheet before being baked because the molding process is easy to perform.

Preferably, the material of the heat radiating member is a single or composite material of the aforementioned materials and has a thermal conductivity of greater than or equal to 10 W/m·K. The material is preferably formed into an original sheet 50 as thin as 10 to 500 μm.

Figure 1:
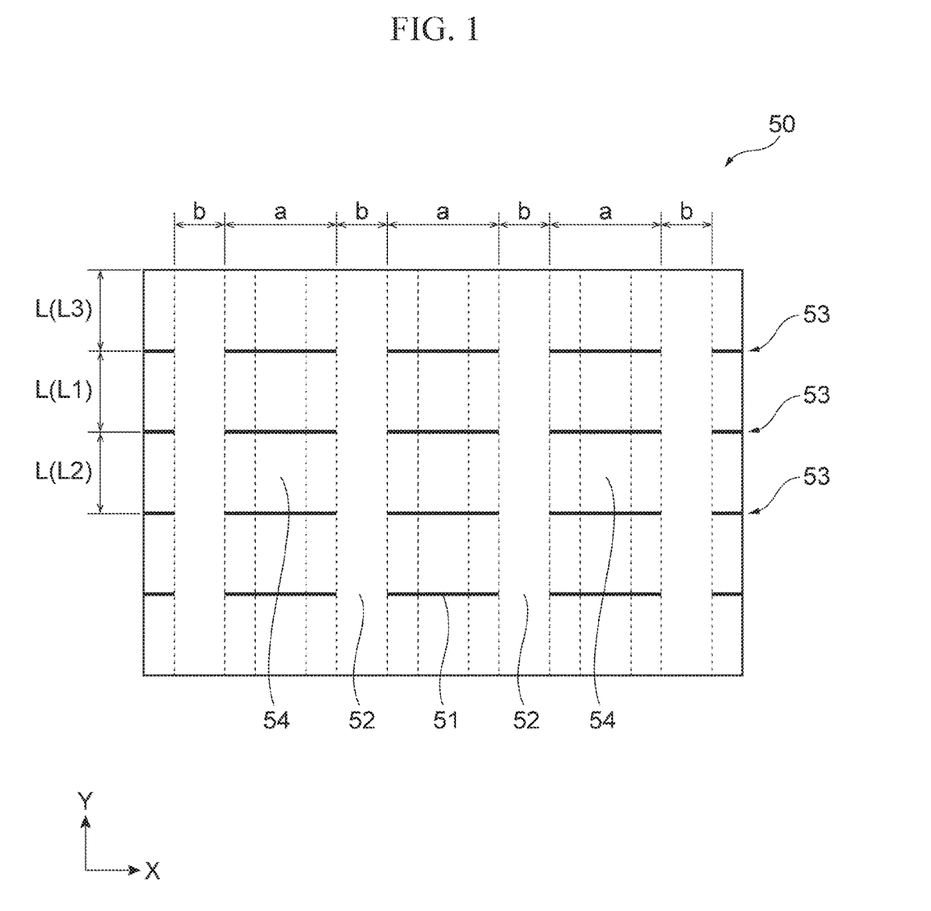
FIG. 1 is a first view showing a heat radiating member used for a heat radiating sheet in conjunction with its production steps.

As shown in FIG. 1, first, a slitting process of forming a required number of slit rows 53, which extend in the X-axis direction, is performed on the original thin sheet 50 using a suitable machine tool. The slit rows 53 include a required number of linear slits 51 with a length of a and non-slit portions 52 with a length of b located between the slits 51,51 that are adjacent in the X-axis direction.

The required number of slit rows 53 are formed in parallel at appropriate intervals of L in the Y-axis direction orthogonal to the X-axis. The intervals of L are desirably all equal, but are not necessarily required to be all equal. The intervals of L between the adjacent, parallel slit rows 53, 53 may be about 0.05 mm to 5 mm. It should be noted that the slitting process is performed so that the positions of the slits 51 and the non-slit portions 52 in the X-axis direction are equal among the respective slit rows 53.

Figure 2A:
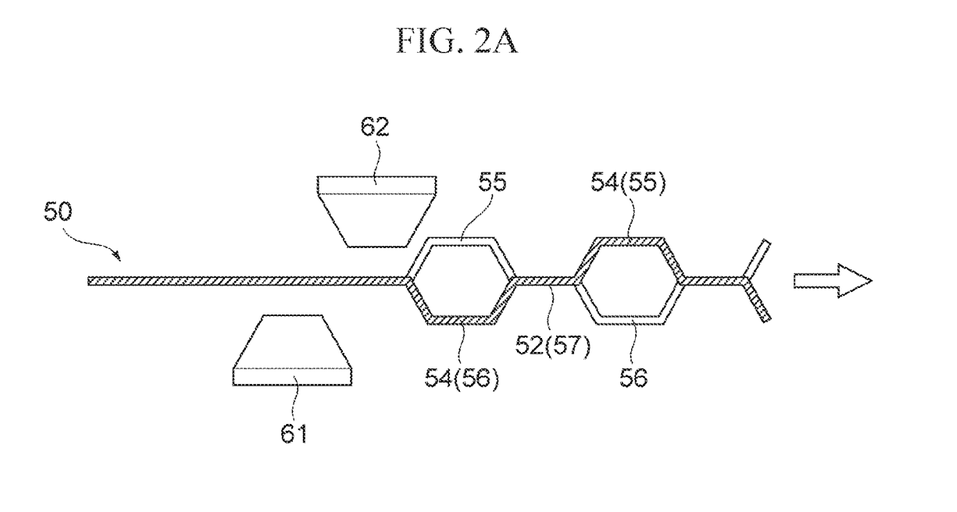
FIGS. 2A and 2B are second views continued from FIG. 1.

Next, a bending process is performed on regions 54 of the original sheet 50 located between the slits 51,51 of the slit rows 53, 53 that are adjacent in the Y-axis direction, using a press machine. The bending process is performed such that as shown in a side view of FIG. 2A, for example, projecting portions 55, which are mountain fold portions, and recess portions 56, which are valley fold portions, are alternately repeated in the adjacent portions in the X-axis direction of the regions 54. For example, a bending process is performed on the original sheet 50 with a moving element 61, which has an upwardly projecting shape in the drawing, pushed upward from below, so as to form the projecting portions 55, and is also with a moving element 62 adjacent in the X-axis direction, which has a downwardly projecting shape, pushed downward from above in the drawing, so as to form the recess portions 56. Such a process is repeated to continuously form the alternately repeated projecting portions 55, which are mountain fold portions, and recess portions 56, which are valley fold portions, in the region of the original sheet 50 indicated by L1 in FIG. 1, for example, that is, in the region between the adjacent slit rows 53,53. Then, flat regions 57 that are regions of the non-slit portions 52 remain between the projecting portions 55 and recess portions 56.

Figure 2B:
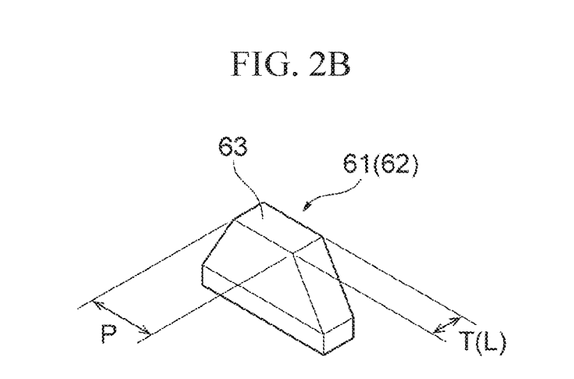

It should be noted that the shapes of the projecting portions 55 and the recess portions 56 depend on the shapes of the moving elements 61 and 62. When moving elements with pointed tip ends are used, the apexes of the projecting portions 55 and the recess portions 56 will have acute angles, while as shown in FIG. 2B, when moving elements having tip ends with flat surfaces 63 are used, the apexes of the projecting portions 55 and the recess portions 56 will have flat surfaces. It should be noted that the horizontal width T of each of the moving elements 61 and 62 is substantially equal to the interval L between the adjacent slit rows 53,53, and the length P of the flat surface 63 at the tip end is shorter than the length a of each slit 51. Although the moving elements 61 and 62 shown herein are trapezoidal in shape in side view, the moving elements 61 and 62 may also be semicircular or elliptical in shape in side view, and in such a case, the moving elements 61 and 62 may have apexes that remain after being cut off along the horizontal plane.

Likewise, as shown in FIG. 1, a bending process is also performed on regions L2, L3 that are adjacent the region indicated by L1 in the Y-axis direction. It should be noted that as indicated by the chain line in FIG. 1, the bending process is performed in the adjacent regions L2, L3 such that recess portions 56, which are valley fold portions, are formed at positions facing the projecting portions 55, which are mountain fold portions, in the region L1 so that the recess portions 56 are formed to face the projecting portions 55, and projecting portions 55, which are mountain fold portions, are formed at positions facing the recess portions 56, which are valley fold portions, in the region L1 so that the projecting portions 55 are formed to face the recess portions 56.

Figure 3:
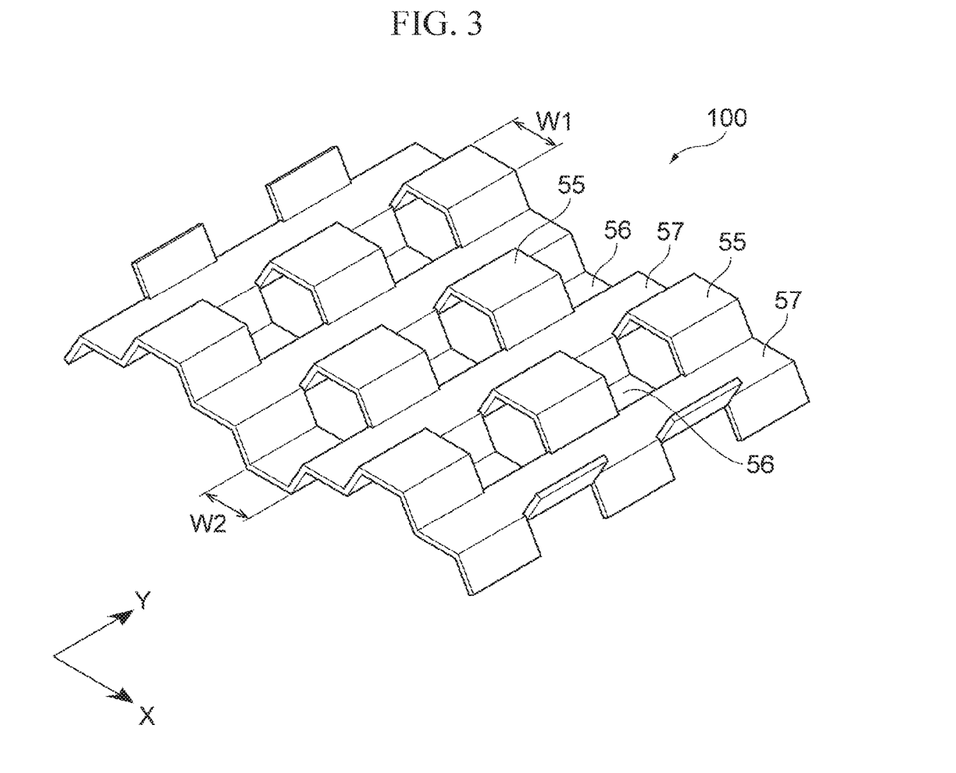
FIG. 3 is a perspective view of a produced heat radiating member.
Figure 4:
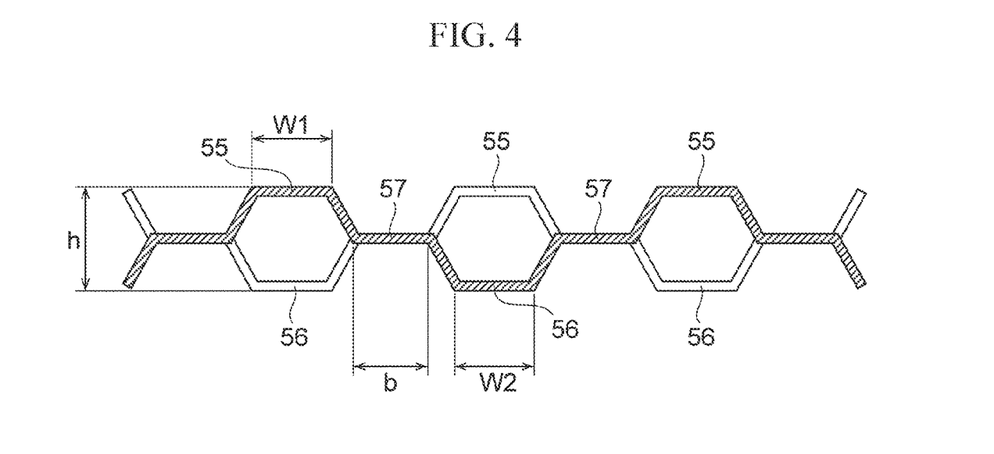
FIG. 4 is a side view of a produced heat radiating member.
Figure 5:
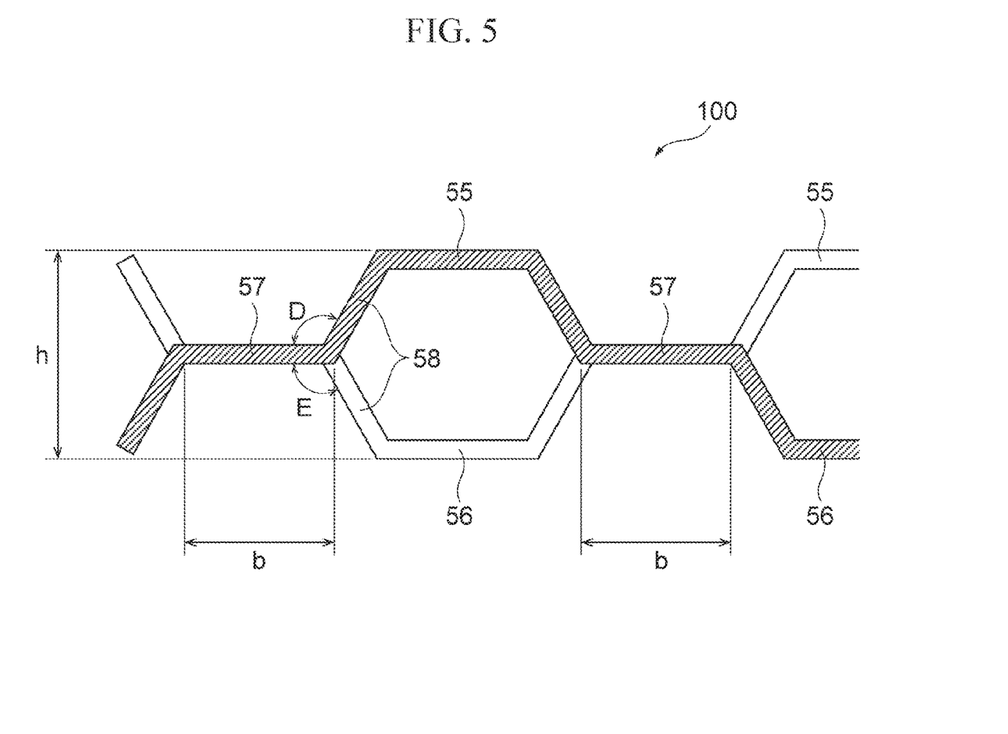
FIG. 5 is a side view of a partially enlarged heat radiating member.

FIGS. 3 and 4 show a perspective view and a side view, respectively, of the heat radiating member 100 obtained by performing a bending process on the original sheet 50 in the planar direction as described above. In addition, FIG. 5 shows a partially enlarged view of FIG. 4. It should be noted that in FIGS. 4 and 5, diagonally shaded portions show a side view of the aforementioned region L1, and hollow portions show a side view of the region L2 (L3) adjacent the region L1 in the Y-axis direction.

As shown in the drawing, the heat radiating member 100 obtained through the bending process is a flat member with a thickness of h as a whole, and the substantially central portion of the heat radiating member 100 in the thickness direction thereof has a required number of the flat regions 57 provided at required intervals in the X-axis direction and each having a width of b in the X-axis direction and having a length in the Y-axis direction corresponding to the entire width of the original sheet 50 in the Y-axis direction.

Between the two adjacent flat regions 57, 57, the projecting portions 55, which protrude upward from the flat regions 57, and the recess portions 56, which protrude downward from the flat regions 57, are alternately formed in the Y-axis direction. The positional relationship between the projecting portions 55 and the recess portions 56 in the Y-axis direction is such that the projecting portion 55 and the recess portion 56 that are adjacent each other are facing each other. Therefore, the heat radiating member 100 with a predetermined thickness h has the required resistance against compression in the perpendicular direction, as well as high bending flexibility both in the X-axis direction and the Y-axis direction.

As mentioned above, changing the shape and size of the tip end of each of the moving elements 61 and 62 used for press work can freely change the shape and size of each of the projecting portions 55 and the recess portions 56. Needless to say, appropriately changing the length a of each linear slit 51, the length b of each non-slit portion 52, and the interval L between the adjacent slit rows 53 can obtain the heat radiating member 100 with desired flexibility. Further, if the heat radiating member 100 is stretched in the X-axis direction after the termination of the desired bending process, the shapes and heights of the projections 55 and the recess portions 56 can also be changed.

Resin Material 300

The aforementioned heat radiating member 100 is buried in the resin material 300 so that a heat radiating sheet 200 is obtained. The resin material 300 may be resin alone or resin filled with fillers so as to have an improved function. Examples of resin include moisture-curable or cold-setting (which may be either one-solution type or two-solution-mixed type) silicone resin; thermosetting resin such as epoxy resin and urethane resin; and thermoplastic resin such as polyamide resin, polyphenylene sulfide resin, and polyimide resin. Examples of fillers include metal fillers such as copper, aluminum, silver, nickel, and zinc; and inorganic fillers such as alumina, silica, boron nitride, zinc oxide, magnesium oxide, and graphite. Further, it is also possible to use a mixed material obtained by forming a material used for producing the aforementioned heat radiating member 100 into particles and mixing them with the resin material 300.

Production of Heat Radiating Sheet 200

Figure 6:
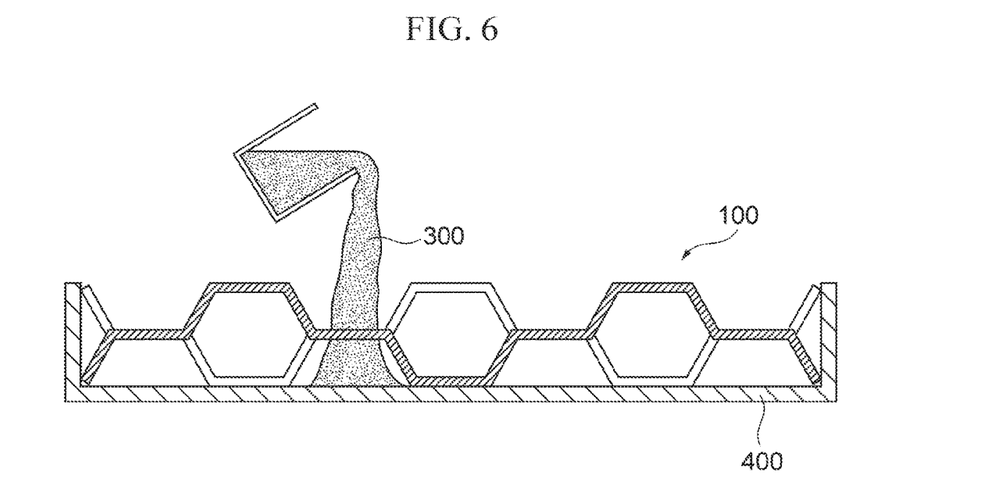
FIG. 6 is a first view showing a step of producing a heat radiating sheet.
Figure 7:
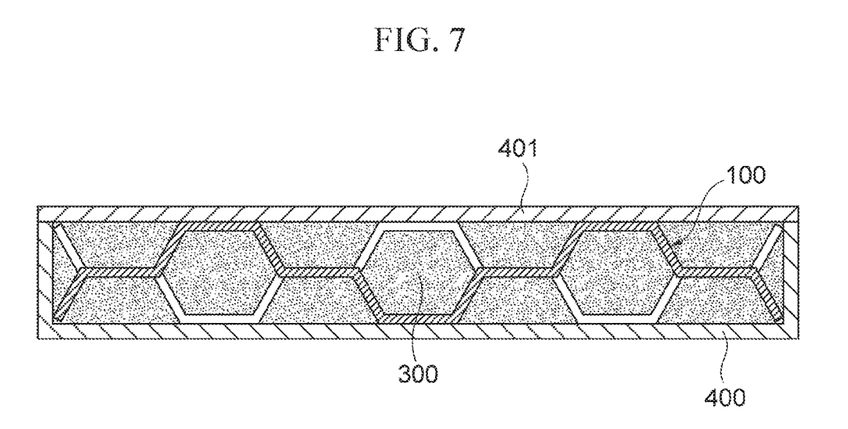
FIG. 7 is a second view showing a step of producing a heat radiating sheet.

The heat radiating member 100 can be buried in the resin material 300 using any method. FIGS. 6 and 7 show examples thereof. As shown in FIG. 6, the heat radiating member 100 formed is put in a mold 400, and end portions thereof are held firmly with a suitable means such as pins so that the dimensions are fixed. Then, the resin material 300 is poured from above. Next, as shown in FIG. 7, a lid 401 is put on the mold 400 to adjust the height and then, the mold 400 is put in a constant-temperature oven to thermally cure the resin material 300. After the resin material 300 is cooled, it is removed from the mold so that the heat radiating sheet 200 with a thickness of h is obtained as shown in a side view of FIG. 8.

Advantages of Heat Radiating Sheet 200

As described above, the heat radiating sheet 200 in this embodiment is produced by using the heat radiating member 100, which has been obtained by performing a slitting process and bending process on the single original thin sheet 50 with high thermal conductivity, as a structural member and burying the entire heat radiating member 100 in the resin material 300.

Figure 8:
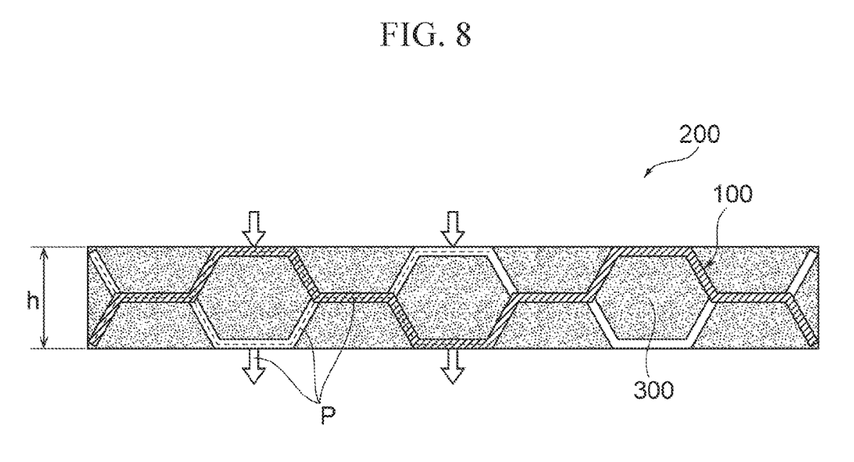
FIG. 8 is a side view showing a heat radiating sheet after production.

Although the heat radiating member 100 is a single structure as described above, it is oriented continuously not only in the planar direction but also in the thickness direction. Therefore, a continuous heat conduction path P is formed as shown in FIG. 8. In addition, since a part of the heat radiating member 100 is located on the upper and lower surfaces of the heat radiating sheet 200, efficient heat transfer can occur at the interface with an adherend (e.g., a heating element), and thermal resistance can thus be lowered in the actual use. Further, since the projecting portions 55 and the recess portions 56 of the heat radiating member 100 are alternately arranged in plan view so that they do not overlap in the perpendicular direction as described above, the projecting portions 55 and the recess portions 56 can flexibly deform both in the XY plan direction and the direction of the thickness h. Furthermore, since the heat radiating member 100 has a spatial region that is continuous in the X-axis direction and the Y-axis direction, the filling property of the heat radiating member 100 with the resin material 300 when the heat radiating member 100 is buried in the resin material 300 is excellent. In addition, for this reason, the resin material 300 can be prevented from coming off the heat radiating sheet 100 after filling, for example, and durability also improves.

Furthermore, since the heat radiating member 100 is structurally strong and has high bending flexibility, there is an advantage in that attachment flexibility for attachment to an electronic component that emits heat by itself, like a CPU, may become high. Further, the heat radiating member 100 can follow not only a flat surface but also other shapes of a workpiece, like an irregular surface or an R surface, which can increase the possibility of usage places. Exemplary usage patterns include a pattern in which the heat radiating sheet 200 after resin filling is used as well as a pattern in which after only the heat radiating member 100 is closely attached to a workpiece, the heat radiating member 100 is filled with the resin material 300 so as to obtain the heat radiating sheet 200.

Another Configuration of Heat Radiating Sheet

The volume fraction of the heat radiating member 100 relative to the total volume of the heat radiating sheet 200 is not particularly limited, but is desirably greater than or equal to 5% and less than or equal to 80%. If the volume fraction is less than 5%, thermal conductivity cannot be increased and the member is not useful as the heat radiating member. Further, since a region that does not contribute to heat radiation is increased and heat transfer unevenness within the heat radiating sheet becomes large, there is a possibility that an unexpected high temperature portion may be generated. Meanwhile, if the volume fraction is over 80%, a heat radiating sheet with high thermal conductivity is obtained. However, the sheet becomes too hard and thermal resistance at the interface with the product becomes high, and in such a case, desired heat radiation performance may not be obtained.

The ratio of the thickness of the original sheet 50 for forming the heat radiating member 100 to the thickness of the heat radiating sheet 200 is preferably greater than or equal to 1:3 and less than or equal to 1:10. If the ratio is less than 1:3, the flexibility of the heat radiating member in the thickness direction against compressive stress becomes low, and the flexibility of the heat radiating sheet would be lost. Therefore, there is a possibility that thermal resistance at the interface with the product becomes high and desired heat radiation performance may not be obtained. Meanwhile, if the ratio is over 1:10, the volume fraction of the heat radiating member cannot be increased and thermal conductivity cannot be increased.

As shown in FIG. 5, when the side view profile of each of the projecting portions 55 and the recess portions 56 is substantially trapezoidal in shape, the orientation angle (inclination angles D and E in FIG. 5) between an inclined plane 58 and the flat region 57 is preferably greater than or equal to 90° and less than or equal to 150°. It should be noted that the inclination angle herein can be freely adjusted with the heat radiating member 100 stretched in the X-axis direction. Accordingly, the thermal conductivity and flexibility of the heat radiating sheet 200 can be appropriately adjusted. In addition, the angles D and E may be either the same or different.

When the heat radiating member 100 has a shape in which the apex of each of the projecting portions 55, which are mountain fold portions, and the recess portions 56, which are valley fold portions, has a flat surface, as shown in FIGS. 3 and 4, the length W1 of the flat surface of the apex of the projecting portion 55 in the X-axis direction, the length W2 of the flat surface of the apex of the recess portion 56 in the X-axis direction, and the length b of the flat region 57 in the X-axis direction preferably satisfy a relationship of W1≥W2>b. If the value of b is greater than the values of W1 and W2, the values of W1 and W2 become small correspondingly, which can result in a decrease in the thermal conductivity. Further, flexibility in the Y-axis direction, in particular, becomes lower. Furthermore, the width b of the flat region 57 is preferably less than or equal to 10 times the thickness of the original sheet 50 from the perspective of the shape following property.

Another Embodiment 1

Figure 9:
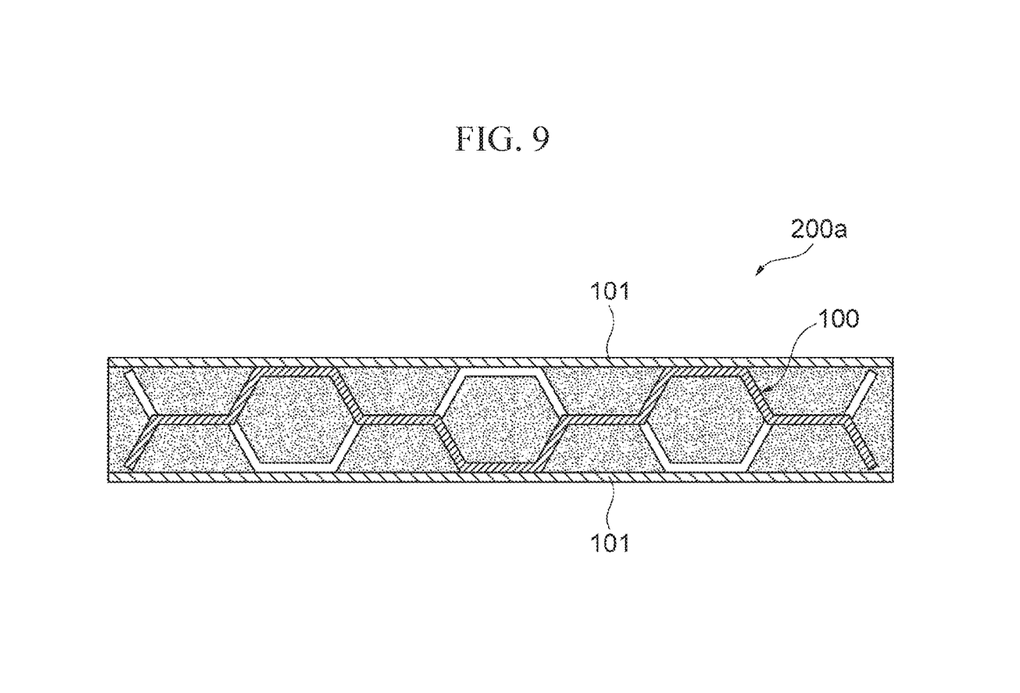
FIG. 9 is a side view showing another embodiment of a heat radiating sheet.

FIG. 9 shows another embodiment of a heat radiating sheet. A heat radiating sheet 200a herein differs from the aforementioned heat radiating sheet 200 in that an insulating layer 101 is provided on each of the front and rear surfaces of the heat radiating sheet 100. The other structures are the same as those of the heat radiating sheet 200. As a material of the insulating layer 101, it is possible to use thermosetting resin such as silicone resin, epoxy resin, or urethane resin; a resin material such as polyamide resin, polyphenylene sulfide resin, or polyimide resin; or ceramic materials such as alumina, silica, or boron nitride. Providing the insulating layer 101 can obtain the heat radiating sheet 200 that ensures both high thermal conductivity and insulating property.

Another Embodiment 2

Figure 10:
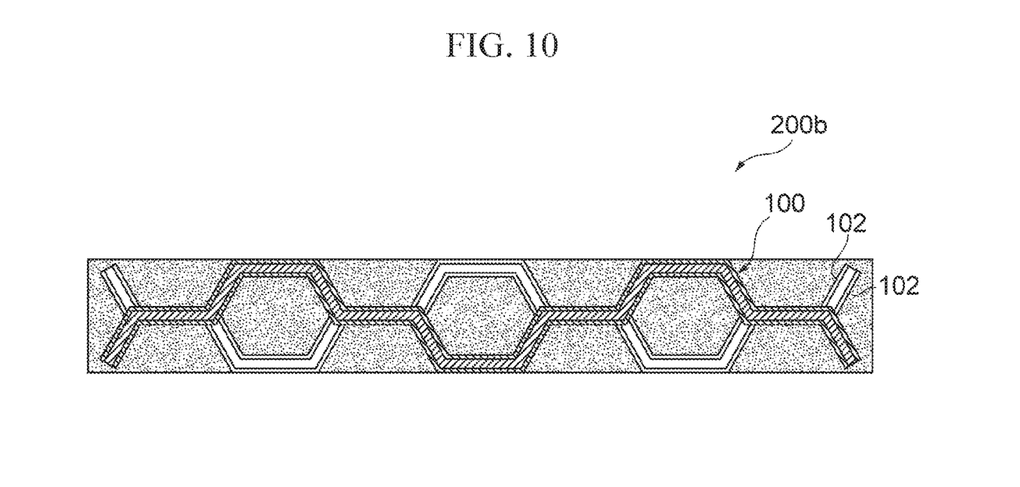
FIG. 10 is a side view showing further another embodiment of a heat radiating sheet.

FIG. 10 shows further another embodiment of a heat radiating sheet. In a heat radiating sheet 200b herein, a heat radiating member 100 is formed using as the original sheet 50 a member that has an insulating film 102 formed on each of the front and rear surfaces thereof. As a material of the insulating film 102, it is possible to use thermosetting resin such as silicone resin, epoxy resin, or urethane resin; a resin material such as polyamide resin, polyphenylene sulfide resin, or polyimide resin; or ceramic materials such as alumina, silica, or boron nitride. Such an insulating sheet 200b can also ensure both high thermal conductivity and insulating property since the heat radiating member 100 per se has insulating performance.

Examples

Hereinafter, the advantages of the heat radiating sheet 200 in accordance with the present disclosure will be described with reference to Examples and Comparative Examples.

Products of Examples

A slitting process and press work were performed on a pure Cu foil with a thickness of 200 μm that is the original thin sheet 50 so that the heat radiating member 100 with the shape shown in FIG. 3 whose specific dimensions are shown in Examples 1, 2, and 3 of Table 1 was produced. Then, as shown in FIGS. 6 and 7, the heat radiating member 100 produced was buried in liquid silicone resin as the resin material 300, and the resin material 300 was thermally cured in a constant-temperature oven so that the heat radiating sheet 200 was obtained.

As shown in Table 1, in each of Examples 1, 2, and 3, the dimensions and shape of the heat radiating member 100 were changed so that the volume fraction of the heat radiating member (Cu) relative to the heat radiating sheet 200 was made different from one another. It should be noted that the silicone resin used herein was KE-1870 (addition-reactive silicone) produced by Shin-Etsu Chemical Co., Ltd, and the curing conditions were: 150° C.×30 minutes, a viscosity of 400 mPa·s, and a hardness after curing of 15 (measured with a durometer A).

Products of Comparative Examples

The heat radiating members 10 were produced using the same material and based on the conventional method described previously with reference to FIGS. 11A to 11C. In production of the heat radiating members 10, the degree of stretch was changed so that the heat radiating sheets of Comparative Examples 1 to 3, which differ in the volume fractions of the heat radiating members (Cu) as shown in Table 1, were produced. It should be noted that the inclination angles of Comparative Examples 1 to 3 are the inclination angle A° shown in FIG. 12B.

Characteristic Tests

The thermal conductivity of each of the products of Examples 1 to 3 and Comparative Examples 1 to 3 was measured using the steady method. Table 1 shows the results.

TABLE 1

|  |  | Examples | | | Comparative Examples | | |
|---|---|---|---|---|---|---|---|
|  |  | 1 | 2 | 3 | 1 | 2 | 3 |
| Volume | Heat Radiating Member | 23 | 25 | 28 | 10 | 20 | 30 |
| Fraction | Resin | 77 | 75 | 72 | 90 | 80 | 70 |
| Dimensions | Inclination Angle [°] *1 | 120 | 120 | 100 | 120 | 120 | 120 |
|  | Length of Flat Surface of Apex of Each of Projecting Portions and Recess Portions (W1 = W2) [mm] | 0.5 | 1.0 | 0.5 | — | — | — |
|  | Length (b) of Each Non-Slit Portion [mm] | 0.3 | 0.3 | 0.3 | — | — | — |
|  | Intervals (L) between Slit Rows [mm] | 1 | 1 | 1 | — | — | — |
|  | Thickness (h, s) of Heat Radiating Sheet [mm] | 1 | 1 | 1 | 1 | 1 | 1 |
| Thermal | Thermal Conductivity [W/mK] | 19 | 23 | 29 | 5 | 11 | 21 |
| Characteristics | Thermal Resistance [° C./W] | 0.19 | 0.15 | 0.12 | 0.91 | 0.44 | 0.23 |

*1: The angle D (=E) shown in FIG. 5 for the Examples and the angle A° in FIG. 12B for the Comparative Examples Evaluation All of the products of Examples 1, 2, and 3 the products of Comparative Examples 1, 2, and 3 have an equal finished thickness (h, s) of 1 mm, and also have a substantially equal volume fraction of each of the heat radiating member and resin. However, the products of Examples 1, 2, and 3 have significantly improved thermal conductivity than those of the products of Comparative Examples 1, 2, and 3. In addition, the products of Examples 1, 2, and 3 also have lower thermal resistance than those of the products of Comparative Examples 1, 2, and 3.

This is because each of the heat radiating members used in Examples 1, 2, and 3 basically has the shape shown in FIG. 3, and accordingly, the heat conduction path P has significantly increased than those of Comparative Examples 1, 2, and 3.

DESCRIPTION OF SYMBOLS

50 Original thin sheet
51 Slit
52 Non-slit portion
53 Slit row
54 Region of the original sheet located between adjacent slit rows
55 Projecting portion that is a mountain fold portion
56 Recess portion that is a valley fold portion
57 Flat region that is a region of a non-slit portion
61, 62 Moving elements of a press machine
63 Flat surface of the tip end of the moving element
100 Heat radiating member obtained by bending the original sheet in the planar direction
101 Insulating layer
102 Insulating film
200, 200a, 200b Heat radiating sheets
300 Resin material
400 Mold
a Length of the slit
b Length of the non-slit portion
h Thickness of the heat radiating member
L (L1, L2, L3) Intervals between adjacent slit rows
P Heat conduction path
W1 Length of the flat portion of the projecting portion in the X-axis direction
W2 Length of the flat surface of the recess portion in the X-axis direction

What is claimed is:
1. A heat radiating sheet comprising:
a resin material; and
a heat radiating member containing a material with higher thermal conductivity than that of the resin material, the heat radiating member extending in a planar direction and having a required thickness,
wherein:
the heat radiating member includes a thin plate,
the thin plate has formed thereon a required number of slit rows each including a required number of linear slits each having a predetermined length and being arranged linearly in an X-axis direction with a required number of non-slit portions each having a predetermined length interposed therebetween, the slit rows being arranged in parallel at intervals in a Y-axis direction orthogonal to the X-axis direction,
portions of the thin plate located between adjacent slits of adjacent slit rows are bent such that projecting portions and recess portions are alternately repeated in the X-axis direction,
the bent portions of the thin plate have a shape such that a projecting portion and a recess portion that are adjacent in the Y-axis direction are located facing each other, and
the heat radiating member is entirely buried in the resin material excluding apexes of the projecting portions and the recess portions.

2. The heat radiating sheet according to claim 1, wherein each of the apexes of the projecting portions and the recess portions has a flat surface.

3. The heat radiating sheet according to claim 1, further comprising an insulating layer formed on each of front and rear surfaces of the heat radiating sheet.

4. The heat radiating sheet according to claim 1, wherein the heat radiating member has an insulating film formed on each of front and rear surfaces thereof.

5. The heat radiating sheet according to claim 1, wherein the heat radiating member contains one of a single material or a composite material with a thermal conductivity of greater than or equal to 10 W/m·K.

6. The heat radiating sheet according to claim 1, wherein the resin material contains one or more of silicone resin, epoxy resin, urethane resin, polyamide resin, polyphenylene sulfide resin, or polyimide resin.

* * * * *